(12) United States Patent  
Byun et al.

(10) Patent No.: US 8,110,787 B1
(45) Date of Patent: Feb. 7, 2012

(54) IMAGE SENSOR WITH A REFLECTIVE WAVEGUIDE

(75) Inventors: Jeong Soo Byun, Cupertino, CA (US); Vladimir Korobov, San Mateo, CA (US); Oliver Pohland, San Jose, CA (US)

(73) Assignee: ON Semiconductor Trading, Ltd, Hamilton (BM)

( * ) Notice: Subject to any disclaimer, the term of this patent is extended or adjusted under 35 U.S.C. 154(b) by 94 days.

(21) Appl. No.: 11/509,480

(22) Filed: Aug. 23, 2006

(51) Int. Cl.
 *H01L 27/00* (2006.01)
(52) U.S. Cl. ............... 250/208.1; 257/225; 257/233
(58) Field of Classification Search .......... 257/225–234; 250/208.1
 See application file for complete search history.

(56) References Cited

U.S. PATENT DOCUMENTS

| | | | |
|---|---|---|---|
| 6,256,016 B1 * | 7/2001 | Piot et al. ................ 345/166 |
| 6,452,186 B1 * | 9/2002 | Wieczorek et al. ...... 250/370.11 |
| 7,012,240 B2 | 3/2006 | Yaung |
| 7,038,232 B2 | 5/2006 | Yaung et al. |
| 7,041,525 B2 | 5/2006 | Clevenger et al. |
| 7,041,956 B2 * | 5/2006 | Takahashi et al. ......... 250/208.1 |
| 7,061,028 B2 | 6/2006 | Yaung et al. |
| 7,326,588 B2 * | 2/2008 | Yaung et al. .................. 438/57 |
| 2005/0274871 A1 * | 12/2005 | Li et al. ....................... 250/208.1 |
| 2006/0145219 A1 * | 7/2006 | Lim ............................. 257/294 |
| 2007/0298533 A1 * | 12/2007 | Yang et al. .................... 438/57 |

* cited by examiner

*Primary Examiner* — David Vu
*Assistant Examiner* — Brandon Fox
(74) *Attorney, Agent, or Firm* — Kevin B. Jackson

(57) ABSTRACT

An image sensor having shield structures and methods of forming the same are provided. Generally, the image sensor includes: (i) substrate having at least one photosensitive element formed therein; (ii) a dielectric layer overlying the substrate and the photosensitive element; and (iii) an annular reflective waveguide disposed in the dielectric layer above the photosensitive element to reduce cross-talk between adjacent elements of the sensor while increasing sensitivity of the sensor. In certain embodiments, the sensor further includes a photoshield disposed in the dielectric above the photosensitive element and about the waveguide to further reduce the possibility of cross-talk. Other embodiments are also disclosed.

20 Claims, 7 Drawing Sheets

IMAGE SENSOR WITH A REFLECTIVE WAVEGUIDE

TECHNICAL FIELD

The present invention relates generally to image sensors, and more particularly to image sensors having shield structures to prevent cross-talk between adjacent sensors and to increase photo intensity of light received thereon and methods for forming the same.

BACKGROUND OF THE INVENTION

Solid-state image sensors are widely used in a number of optoelectronic applications including digital cameras, cellular phones, and optical navigation or pointing systems, such as optical computer mice, trackballs, touch screens scroll bars and the like. Conventional solid-state image sensors typically include an array of photosensitive elements, such as charge-coupled devices (CCDs) or complementary metal oxide semiconductor (CMOS) photodiodes. Typically, one or more adjacent photosensitive elements are coupled in an elementary unit or picture element commonly known as a pixel.

A conventional image sensor will now be described with reference to FIGS. 1A and 1B. Referring to FIG. 1A, a portion of the image sensor 100 is shown in cross section. The image sensor 100 typically includes a semiconductor substrate 102 in or on which an array of pixels 104A, 104B has been formed. Each pixel 104A, 104B shown in these figures can include one or more adjacent photosensitive elements, for example, CCDs or photodiodes (not shown). The pixels 104A, 104B convert incoming light 106 from an imaging plane or a light source 108 into electrical signals via the CCDs or photodiodes. The substrate 100 is covered by one or more dielectric layers 110, which may be substantially transparent to the incoming light 106, or may include a number of transparent portions 112, as shown, extending therethrough to transmit the incoming light to the pixels 102A, and 102B.

Incident light 106 striking the top surface of the sensor 100 transmitted through the underlying dielectric layer 110 or the transparent portion 112 of the dielectric down to the underlying pixel 102A or 102B. However, it is a common occurrence for the incident light 106 to strike the top surface of the sensor 100 surface at a variety of angles. Thus, light 106 striking the image sensor 100 at a perpendicular or nearly perpendicular angle to a surface thereof is propagated unimpeded to the underlying pixel 102A. However, where the dielectric layer 110 is substantially transparent to at least some wavelengths of the incoming light 106, and part of the light 106A strikes the image sensor 100 at other than a perpendicular angle, a portion of the light can be transmitted to the adjacent pixel 102B rather than the pixel 102A underlying the strike location. This undesirable effect is commonly called cross-talk and results in reduced accuracy or image resolution of the image sensor 100. Moreover, even where this scattering of light in dielectric does not result in striking an adjacent pixel 102B causing cross-talk, the loss or non-sensing of the light by the pixel 102A underlying the strike location results in reduced photo-efficiency or sensitivity of the image sensor 100.

Referring to FIG. 1A, one approach used in conventional image sensors 100 to minimize if not eliminate cross-talk is the introduction of one or more intermetal dielectric (IMD) layers 114A, 114B overlying or between the dielectric layers 110 to reduce or impede the transmission of light therethrough. FIG. 1B, illustrates a top planar view of a portion of the image sensor 100 of FIG. 1A, showing a top IMD layer 114A and lower IMD layer 114B in cut-away. This solution is not wholly satisfactory in that depending on the number, location and size of the IMD layers 114A, 114B not all of the light 106A striking at a highly oblique angle will be stopped, and the IMD layers do not improve the photo-efficiency or sensitivity of the image sensor 100. Moreover, the use of multiple metal IMD layers 114A, 114B requires they be isolated from one another and conducting elements of the image sensor. This requirement in turn causes an increase in the pixel size, or a decrease of the number of pixels within the image sensor.

FIGS. 2A and 2B illustrate another approach used in conventional image sensors 200 to reduce cross-talk and improve photo-efficiency or sensitivity of the image sensor. In this approach the image sensor 200 further includes an air-gap 202 or ring of dielectric material (not shown), in a transparent dielectric layer 204 surrounding each pixel 206A, 206B on the substrate 208. Referring to FIG. 2A, light 210 from a light source 212 striking the image sensor 200 at a perpendicular or nearly perpendicular angle to a surface of the image sensor 200 is propagated unimpeded to the underlying pixel 206A. Due to differences in refraction between the material of the dielectric layer 204 and the air-gap 202, light 210 striking at a less than perpendicular angle is reflected from an interface between the dielectric layer 204 and the air-gap 202, and back towards the underlying pixel 206A, thereby reducing cross-talk and improving photo-efficiency of the image sensor 200. However, where the incoming light 210 strikes the image sensor 200 at a highly oblique angle, the difference in refraction is insufficient to reflect all of the light, and a portion of the light 210A can be transmitted to the adjacent pixel 206B rather than the underlying pixel 206A.

Yet another common approach in conventional image sensors to reduce cross-talk and improve photo-efficiency uses a number or an array of micro-lens (not shown) to focus light onto each element or pixel of the image sensor. This approach is also not wholly satisfactory for a number of reasons. First, as with the other approaches outlined above for light striking the micro-lens array at a highly oblique angle, the lens may be insufficient to redirect all of the light toward the underlying pixel, and away from the adjacent pixel. Moreover, the fabrication of the micro-lens array and/or mating the array with the pixels of the image sensor can significantly increase the cost and/or decrease the throughput and yield of working devices.

Accordingly, there is a need for an image sensor and method of fabricating the same that substantially eliminates cross-talk between adjacent pixels while increasing or improving photo-efficiency or sensitivity of the image sensor. It is further desired that the sensor does not include shields that increase pixel size or reduce the number of pixels of the image sensor. It is still further desirable that the sensor does not require micro-lenses, which increase cost of fabricating the image sensor.

The present invention provides a solution to these and other problems, and offers further advantages over conventional image sensor and method of fabricating the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to image sensors having an array of multiple photosensitive elements or pixels, and more particularly to image sensors having shield structures to substantially prevent cross-talk between adjacent pixels and to increase photo intensity of light received thereon.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The terms "coupling" and "to couple" as used herein may include both to electrically connect directly and indirectly connect through one or more intervening layers or components.

Briefly, an image sensor having an architecture according to an embodiment of the present invention includes: (i) a substrate having a surface with at least one photosensitive element formed therein; (ii) a dielectric layer disposed on the substrate overlying the photosensitive element; and (iii) an annular reflective guard ring or waveguide disposed in the dielectric layer above the photosensitive element. The waveguide is located such that light incident on a top surface of the image sensor at other than a perpendicular angle is reflected from the waveguide toward the underlying photosensitive element, thereby increasing an intensity of light striking the photosensitive element and reducing or eliminating cross-talk between adjacent photosensitive elements.

Optionally, the image sensor further includes a photoshield adapted to substantially prevent light passing therethrough disposed above and about the photosensitive element, to further decrease or reduce the possibility of cross-talk between adjacent photosensitive elements or pixels.

Image sensors having shield structures according to various embodiments of the present invention will now be described in greater detail with reference to FIGS. 3A to 5. For purposes of clarity, many of the details of semiconductor fabrication in general and fabrication of image sensors in particular that are widely known and are not relevant to the present invention have been omitted from the following description.

Figure 1A:
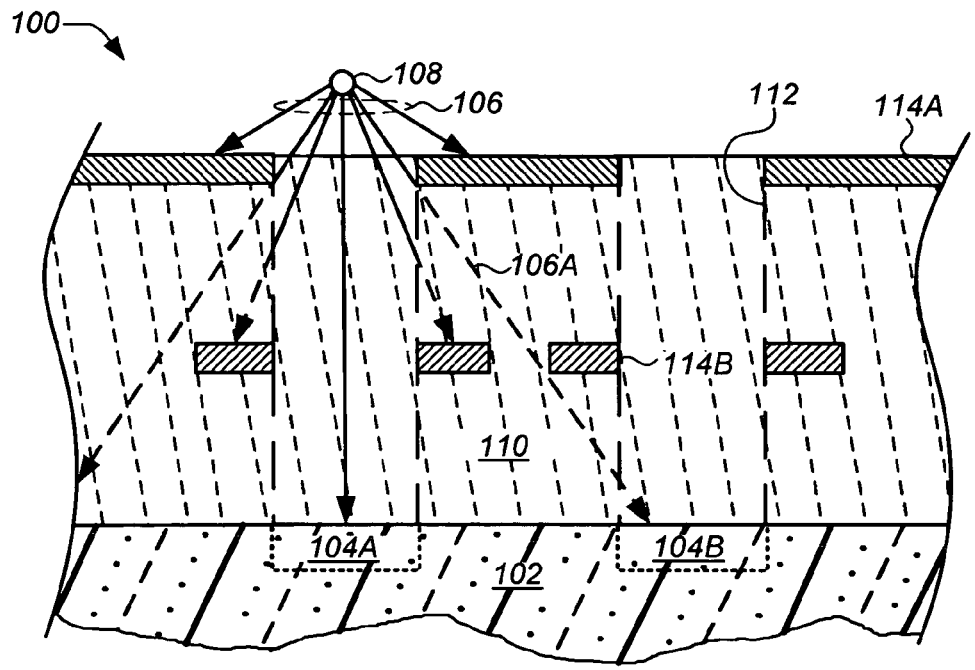
FIGS. 1A and 1B (prior art) are block diagrams illustrating a conventional image sensor architecture having multiple intermetal dielectric layers disposed in a dielectric overlying a photosensitive element on a substrate.
Figure 1B:
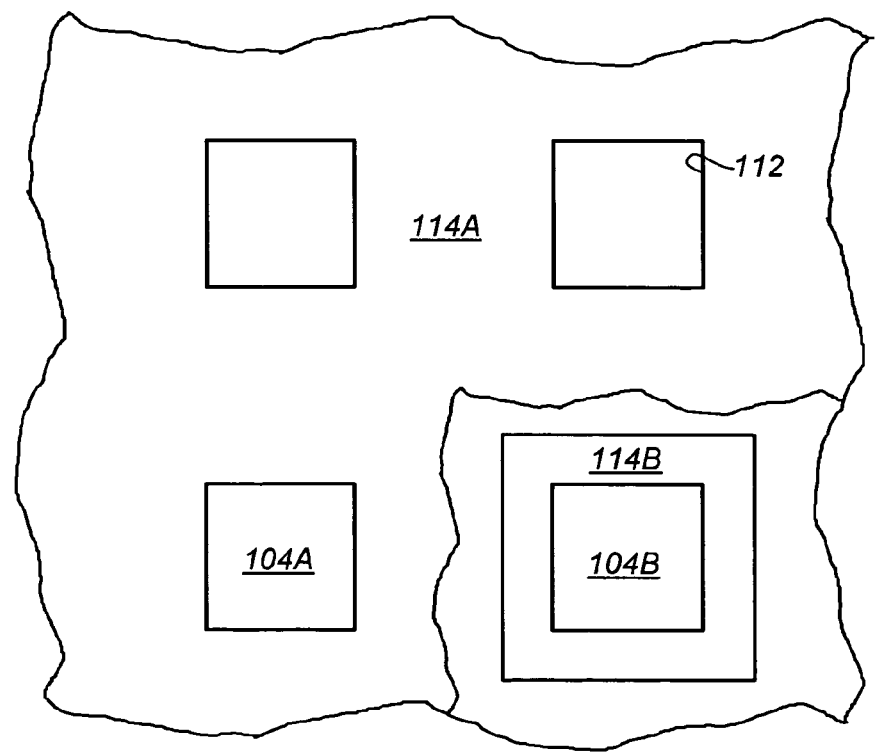
Figure 2A:
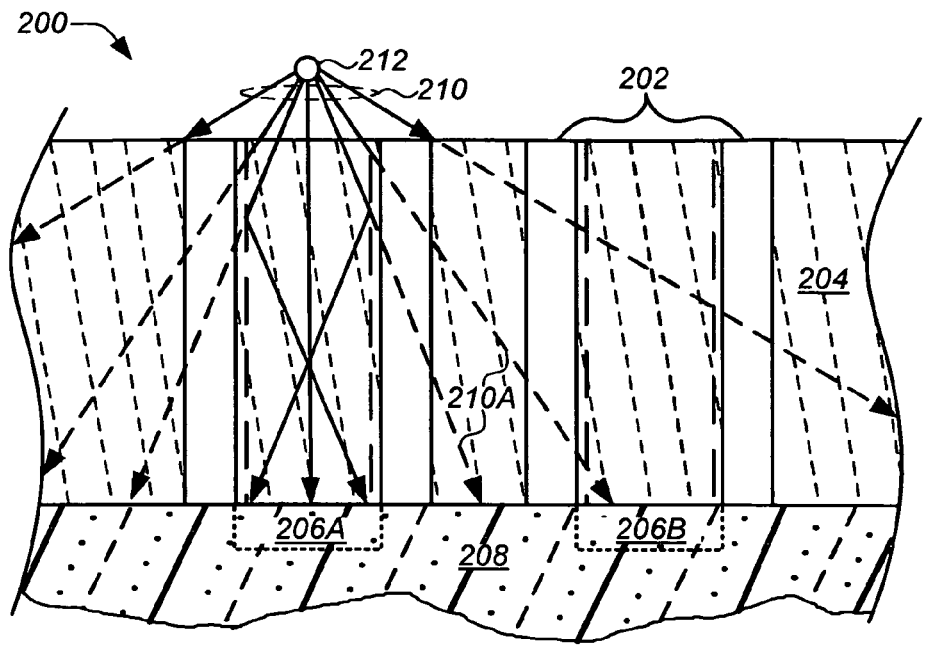
FIGS. 2A and 2B (prior art) are block diagrams illustrating a conventional image sensor architecture having an air-gap or ring disposed in the dielectric overlying a photosensitive element on a substrate.
Figure 2B:
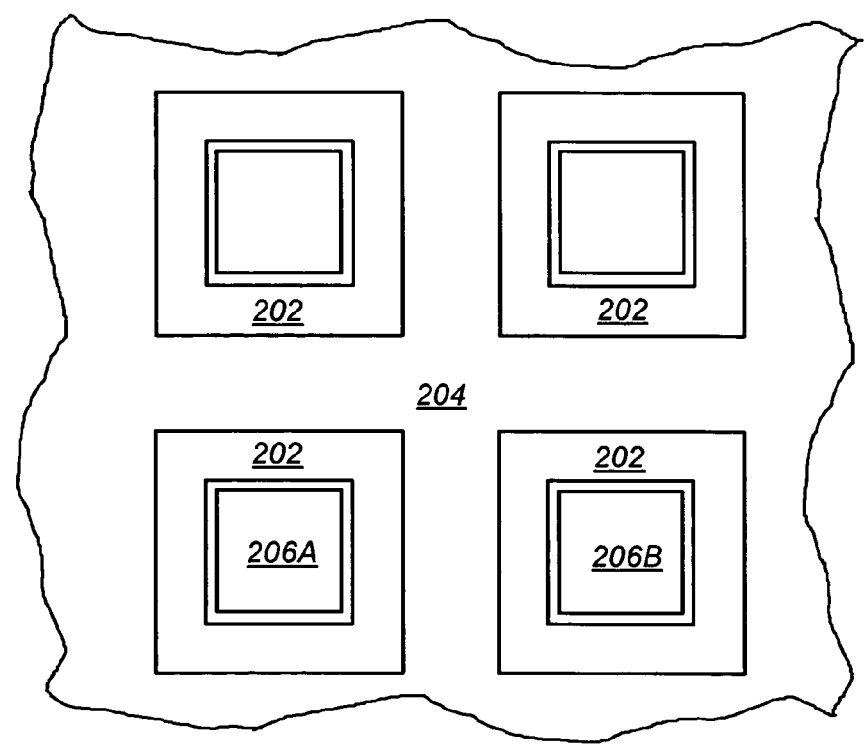
Figure 3A:
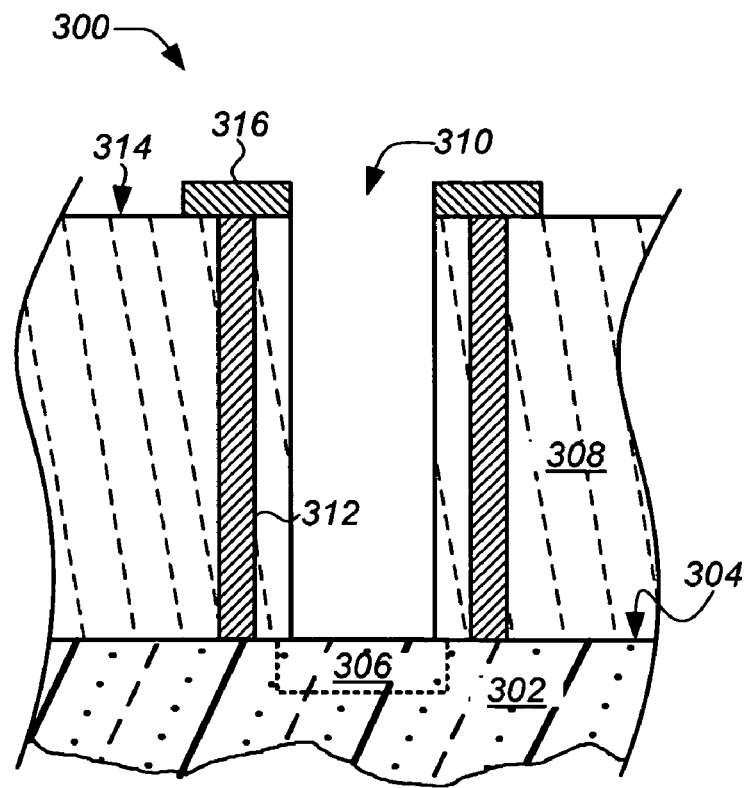
FIGS. 3A and 3B are block diagrams illustrating an image sensor architecture according to an embodiment of the present invention having shield structures including a waveguide formed in a trench surrounding a sensor or photosensitive element formed on a substrate.
Figure 3B:
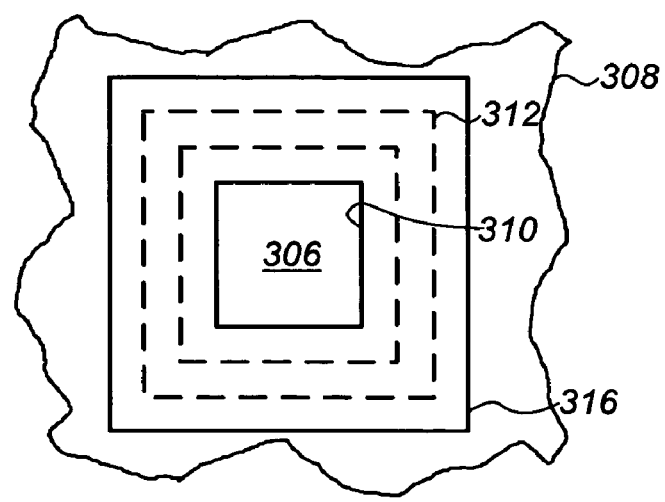

In one embodiment, illustrated in FIGS. 3A and 3B, the waveguide is formed in a trench in a dielectric overlying and surrounding the sensor or photosensitive element. FIG. 3A depicts a partial cross-sectional view of an image sensor 300 having one such a trench surrounding sensor or TSS architecture. FIG. 3B illustrates a top planar view of a portion of the image sensor 300 of FIG. 3A. Referring to FIGS. 3A and 3B, the image sensor 300 generally includes a semiconductor wafer or substrate 302 having a surface 304 in or on which an array of one or more photosensitive elements or pixels 306 has been formed. It will be appreciated that each pixel 306 can include one or more adjacent photosensitive devices (not shown), such as charge-coupled devices (CCDs), photodiodes (PDs), phototransistors or the like, to convert incoming light from an imaging plane or a light source into electrical signals.

The substrate 302 may include any known semiconductor material, such as Silicon, Gallium-arsenide, Germanium, Gallium-nitride, Aluminum-phosphide, and mixtures or alloys thereof. Preferably, the substrate 302 is a doped or undoped silicon-based semiconductor substrate, such as a monocrystalline silicon, silicon-germanium, silicon-on-insulator, or silicon-on-sapphire substrate.

The substrate 302 is covered by a dielectric layer 308, which may be substantially transparent to the incoming light and/or may further include a number of openings 310, as shown, extending therethrough to transmit the incoming light to the pixels 306. Preferably, the dielectric layer 308 is a composite dielectric layer made up of one or more layers of dielectric material having desired electrical and optical properties. Suitable dielectric materials can include, for example, silicon dioxide ($SiO_2$), silicon nitride ($SiN_y$), silicon-oxynitride ($SiO_xN_y$), or other advanced or low-k dielectric materials such as FSG. More preferably, the finished dielectric layer 308 has a total thickness from of about 5,000 angstroms (Å) to about 20,000 Å, depending on the number of layers in a multi-layer dielectric.

In a preferred embodiment, the annular reflective guard ring or waveguide 312 can extend from a top surface 314 of the dielectric layer 308 to the surface 304 of the substrate 302, as shown in FIG. 3A. In alternative embodiments, not shown, the waveguide 312 can begin below the top surface 314 of the dielectric layer 308 and/or end a predetermined distance from the surface 304 of the substrate 302. Each of the waveguides 312 form an annular ring about or around each of the pixels 306. It will be appreciated that the waveguides 312 can include a single cylindrical wall surrounding the pixel 306 or a number of individual, intersecting walls as shown in FIG. 3B.

Generally, in the TSS architecture shown the waveguides 312 surround the pixel 306 and may be located from a point immediately above or adjacent to the pixel to a location some distance away, adjacent to the neighboring pixels. The waveguides 312 can include a square, rectangular or circular cross-section depending on the shape of the pixel 306 or group of pixels surrounded thereby, and preferably has dimensions selected in relation to the pixel size or pitch, which in turn are generally selected in relation to a wavelength of sensed light.

More preferably, the reflective waveguide 312 includes a metal. Most preferably, the waveguide 312 has a composite structure made up of a number of layers of a refractory metal and/or a refractory metal-nitride, such as Titanium (Ti), Titanium-Nitride (TiN), Tungsten (W) and Tungsten-Nitride (WN).

Optionally, as in the embodiment shown in FIGS. 3A and 3B, the image sensor 300 further includes a photoshield 316 overlying the dielectric layer 308 and the waveguide 312 and disposed about the pixel 306. Generally, the photoshield 316 also includes one or more layers of a reflective material such as a metal and/or a metal nitride to further decrease or reduce cross-talk between adjacent pixels. Preferably, all of the photoshields 316 are formed from a single patterned layer or number of layers of a refractory metal and/or a refractory metal-nitride, such as Ti, TiN, W and WN. In certain embodiments, described in greater detail below, this patterned refractory metal or refractory metal-nitride layer may also be used as a hardmask layer during fabrication or manufacture of the image sensor 300.

It will be appreciated that because the waveguide 312 and the photoshields 316 are formed from a substantially reflective and opaque material, and because the waveguide 312 extends substantially from the top surface 316 of the dielectric layer 308 to the surface 304 of the substrate 302, the radial dimensions or thicknesses of both the waveguide and the photoshields can be significantly reduced as compared to the IMD layer 114 and air-gap 202 or rings of the prior art. For example, in the TSS architecture shown the waveguide 312 can have a radial or sidewall thickness of from about 10 Å to about 100 Å, while the photoshields 316 can extend from the opening 310 or the pixel 306 to a point substantially adjacent to the neighboring pixels or openings thereto. Thus, avoiding the increase in pixel size or reduction in pixel count required in the prior art while still eliminating cross-talk and increasing the intensity of light received by the pixels 306, thereby improving photo-efficiency or sensitivity of the image sensor 300.

Figure 4A:
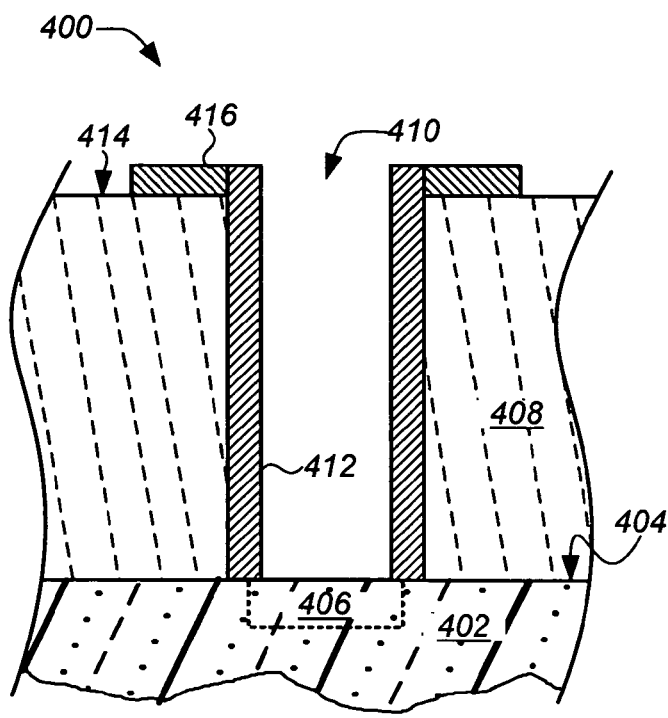
FIGS. 4A and 4B are block diagrams illustrating an image sensor architecture according to another embodiment of the present invention having shield structures including a waveguide formed in a trench above a sensor or photosensitive element formed on a substrate.
Figure 4B:
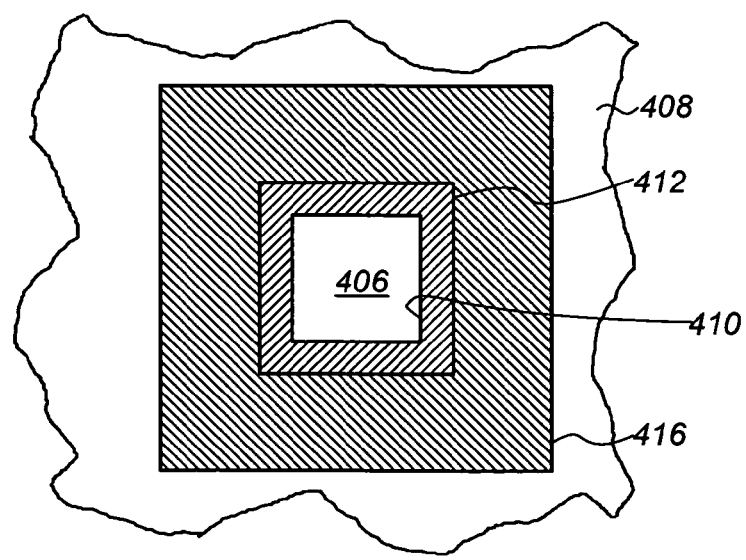

In another embodiment, illustrated in FIGS. 4A and 4B, the waveguide is formed in a trench in a dielectric overlying and immediately above the sensor or photosensitive element. FIG. 4A depicts a partial cross-sectional view of an image sensor 400 having one such a trench above sensor or TAS architecture. FIG. 4B illustrates a top planar view of a portion of the image sensor 400 of FIG. 4A. Referring to FIGS. 4A and 4B, the image sensor 400 generally includes a semiconductor substrate 402 having a surface 404 in or on which an array of one or more photosensitive elements or pixels 406 has been formed. As in the TSS architecture described above with respect to FIGS. 3A and 3B, each pixel 406 can include one or more adjacent photosensitive devices (not shown), such as CCDs, PDs, phototransistors or the like.

As also described above, the substrate 402 may include any known semiconductor material, and preferably is a doped or undoped silicon-based semiconductor substrate.

The substrate 402 is covered by a dielectric layer 408, which may be substantially transparent to the incoming light or may further include a number of openings 410, as shown, extending therethrough to transmit the incoming light to the pixels 406. As in the TSS architecture described above with respect to FIGS. 3A and 3B, the dielectric layer 408 is preferably a composite dielectric layer made up of one or more layers of dielectric material including, for example, $SiO_2$, $SiN_y$, $SiO_xN_y$, or other advanced dielectric materials such as FSG. More preferably, the dielectric layer 408 has a total thickness from of about 5,000 Å to about 20,000 Å, as in the TSS architecture described above.

Preferably, the annular reflective guard ring or waveguide 412 includes a number of layers of a refractory metal and/or a refractory metal-nitride, such as Ti, TiN, W and WN. More preferably, the waveguide 412 extends throughout the dielectric layer 408 from a top surface 414 thereof to the surface 404 of the substrate 402, and abuts the opening 410 to clad or form a sidewall of thereof.

In one embodiment, described in greater detail below, the waveguide 412 is formed by depositing at least a first glue layer of Ti or TN formed directly on the sidewalls of the opening 410 in the dielectric layer 408, followed by further layers of metal, such as W or Ti, and the subsequent removal of metal on bottom surfaces of the opening to expose the pixel 406.

Optionally, the trench or opening 410 may be filled with a void-less dielectric material substantially transparent to a wavelength of light to which the number of photosensitive elements is sensitive. Suitable materials include, for example, spin-on-glass (SOG), phosphosilicate glass (PSG), or borophosphosilicate glass (BPSG).

As shown in FIG. 4A, the image sensor 400 can further include a photoshield 416 overlying the dielectric layer 408 and disposed about the reflective waveguide 412 to further decrease or reduce cross-talk between adjacent pixels 406. Generally, the photoshield 416 includes more or more layers of a reflective material, such as a metal and/or a metal-nitride. Preferably, all of the photoshields 416 in the image sensor 400 are formed from a single patterned layer or number of layers of a refractory metal and/or a refractory metal-nitride, such as Ti, TiN, W and WN.

In certain embodiments, described in greater detail below, this patterned refractory metal or refractory metal-nitride layer may also be used as a hardmask layer during fabrication or manufacture of the image sensor 400 to form or etch the openings 410 in the dielectric layer 408.

It will be appreciated that because of the manner in which the waveguide 412 and the photoshields 416 are formed the radial dimensions or thicknesses of the waveguide can be significantly less than that of the IMD layer 114 and air-gap 202 or rings of the prior art, and even that of the waveguide 312 used in the TSS architecture. For example, in the TAS architecture shown the waveguide 412 can have a radial or sidewall thickness of from about 10 Å to about 100 Å.

As with the TSS architecture of FIGS. 3A and 3B, the waveguides 412 can include a square, rectangular or circular cross-section depending on the shape or of the pixel 406 or group of pixels enclosed, and can be located from a point immediately above or adjacent to the pixel to a location some distance away, adjacent to the neighboring pixels. More preferably, the waveguides 412 have cross-sectional dimensions selected in relation to the pixel size or pitch, which in turn are generally selected in relation to a wavelength of sensed light.

Figure 5:
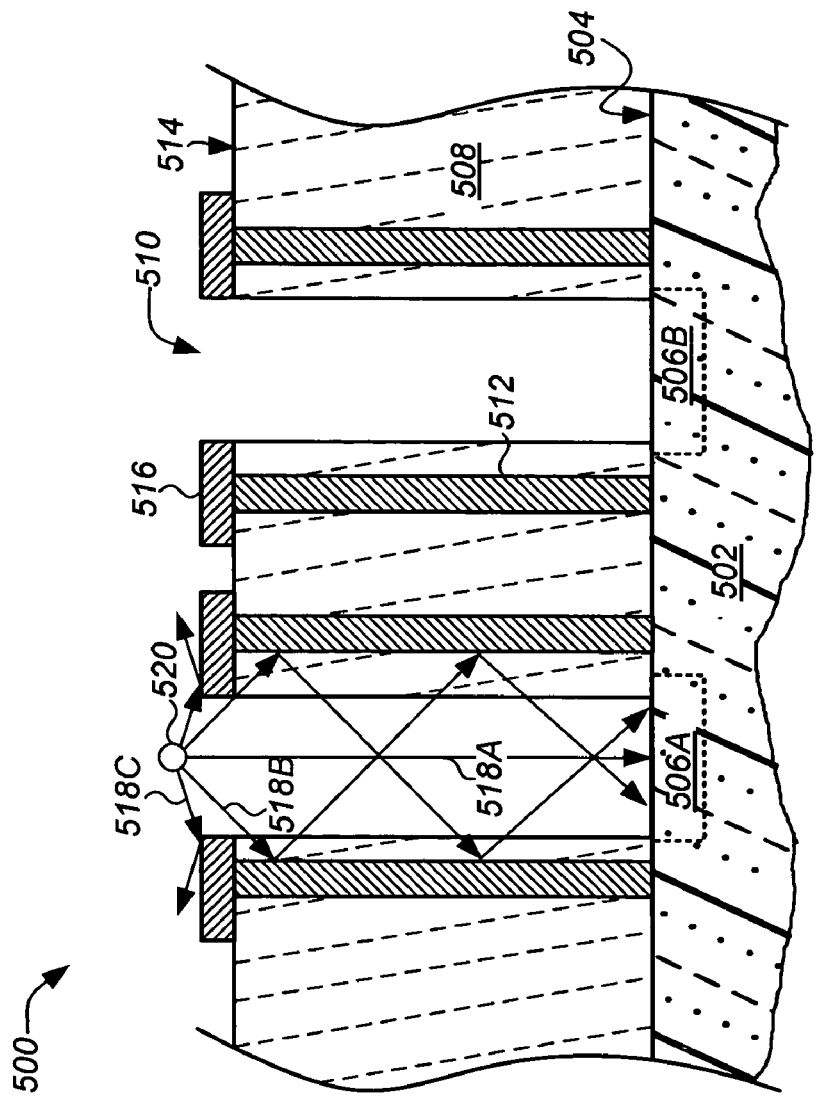
FIG. 5 is a block diagram of a portion of an image sensor having a trench surrounding a sensor (TSS) architecture and illustrating the ability of the present invention to prevent cross-talk between adjacent photosensitive elements and to increase photo intensity of light received thereon.

The ability of an image sensor having shield structures according to the present invention to prevent cross-talk between adjacent photosensitive elements and to increase photo intensity of light received thereon will now be illustrated with reference to FIG. 5. FIG. 5 is a block diagram of a portion of an image sensor 500 having a trench surrounding a sensor (TSS) architecture similar to that described in detail above with reference to FIGS. 3A and 3B. To review, the image sensor 500 generally includes a substrate 502 having a surface 504 in which an array of pixels 506A and 506B has been formed. The substrate 502 is covered by a dielectric layer 508, which includes a number of openings 510 through which incoming light is transmitted to the pixels 506A and 506B. The shield structures shown in FIG. 5 include an annular reflective guard ring or waveguide 512 extending from a top surface 514 of the dielectric layer 508 to the surface 504 of the substrate 502, and a photoshield 516 overlying the dielectric layer and the waveguide and disposed about the pixels 506A and 506B.

Referring to FIG. 5, light 518A from a light source 520 striking the image sensor 500 at a perpendicular or nearly perpendicular angle to a surface of the image sensor 200 is propagated unimpeded to the underlying pixel 506A. Light 518B striking at a less than perpendicular angle is reflected from the waveguide 512 back towards the underlying pixel 506A. Because substantially the entire light incident on the reflective waveguide 512 is reflected, unlike with the air-gap 202 of the prior art, the photo-efficiency of the image sensor 500 is improved. Moreover, even where the incoming light 518C strikes the image sensor 500 at a highly oblique angle, photoshield 516 blocks propagation of the light to an adjacent pixel 506B, thereby substantially reducing if not eliminating cross-talk.

Figure 6:
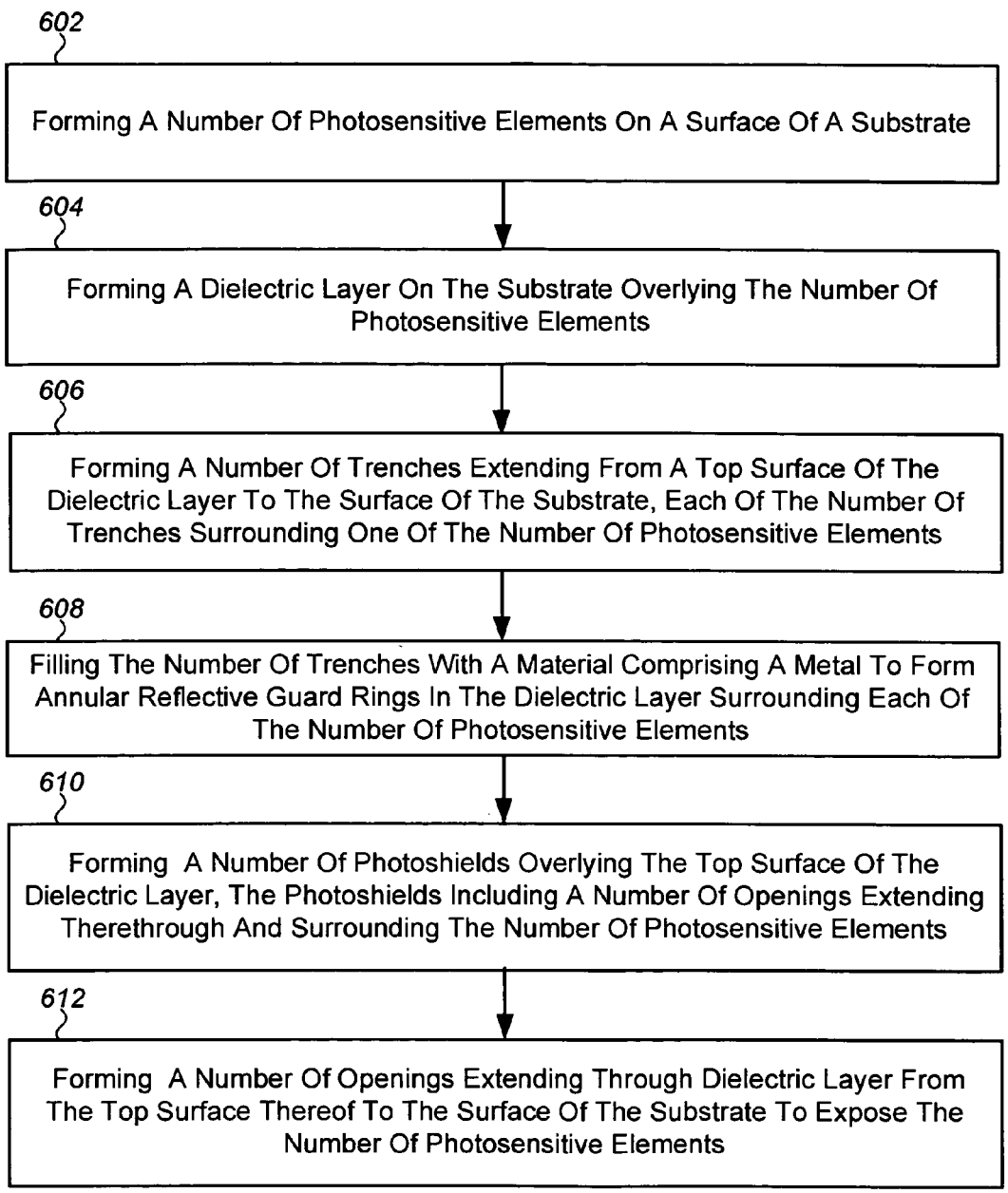
FIG. 6 is a flowchart of a method for forming an image sensor having a TSS architecture according to an embodiment of the present invention.
Figure 7:
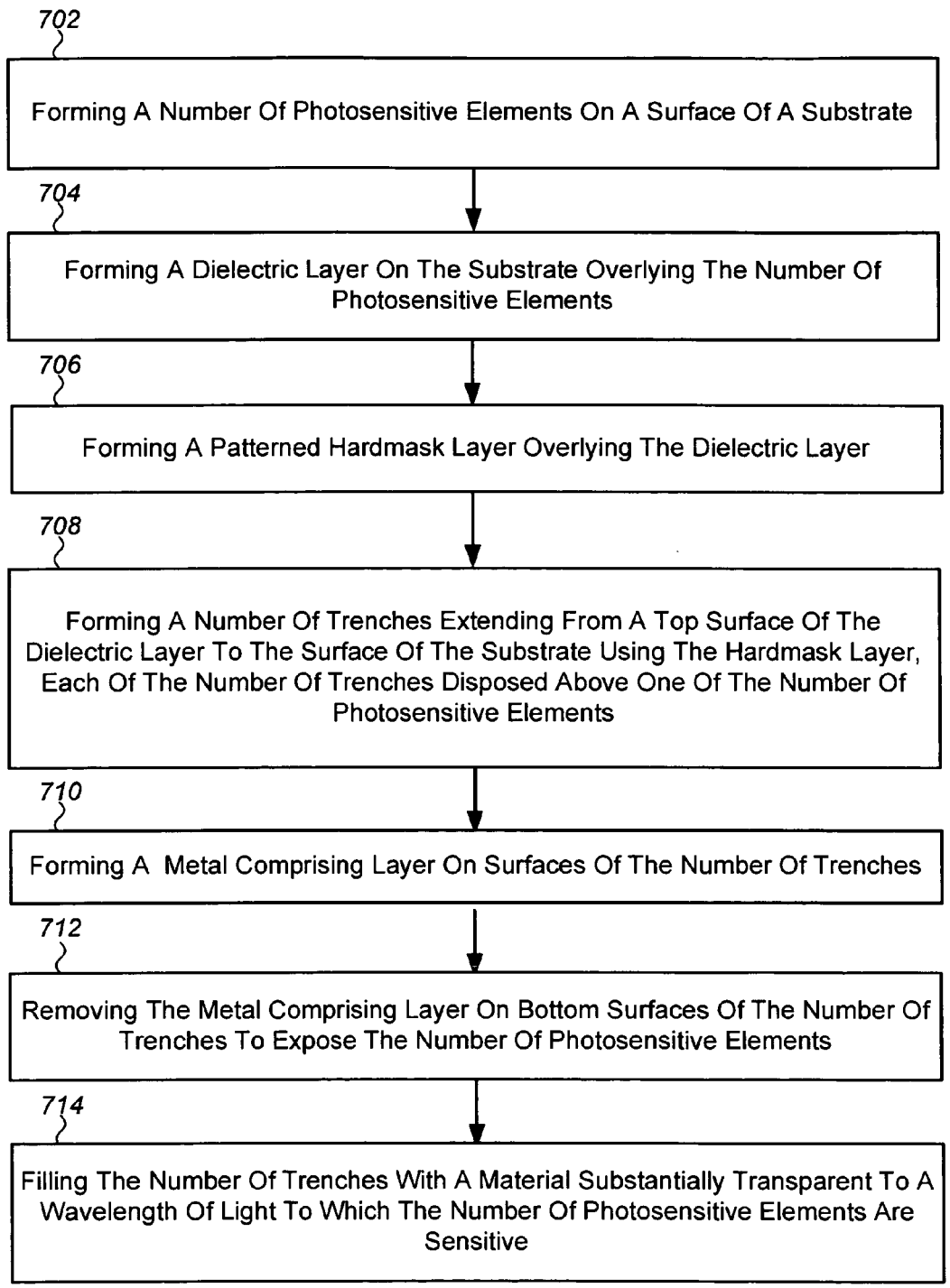
FIG. 7 is a flowchart of a method for forming an image sensor having a trench above a sensor (TAS) architecture according to an embodiment of the present invention.

Methods for fabricating image sensors having shield structures to substantially prevent cross-talk between adjacent pixels and to increase photo intensity of light received thereon according to various embodiments of the present invention will now be described in greater detail with reference to FIGS. 6 and 7, where FIG. 6 is a flowchart of a method for forming an image sensor having a TSS architecture, and FIG. 7 is a flowchart of a method for forming an image sensor having a TAS architecture.

Referring to FIG. 6, the method begins with forming a number of photosensitive elements or pixels on a surface of a substrate (step 602). Generally, the photosensitive elements are fabricated using standard semiconductor fabrication processes, and can each include a plurality of photosensitive devices, such as photo-diodes or CCDs, as described above. Next, a dielectric layer is formed on the substrate overlying the photosensitive elements (step 604). The dielectric layer may be a composite of one or more layers of dielectric material, such as $SiO_2$, SiN or SiON, and is generally formed any suitable standard processing means including, for example, being thermally grown, or deposited using Chemical Vapor Deposition (CVD).

A number of trenches are formed in the dielectric layer, each of the trenches disposed about one of the photosensitive elements (step 606). The trenches may be formed or etched in the dielectric layer using any suitable, highly anisotropic dielectric etch process including, for example, it may be etched using a low pressure radiofrequency (RF) or microwave (MW) plasma containing fluorinated hydrocarbon and/or fluorinated carbon compounds.

Next, the trenches are filed with a metal comprising reflective material to form annular reflective guard rings or waveguides in the dielectric layer disposed about each of the number of photosensitive elements (step 608). Preferably, as noted above, the trenches are filled with one or more layers of Ti, TiN or W, using any suitable standard processing means including, for example, CVD, Metal Organic CVD (MOCVD), or atomic layer deposition (ALD).

Preferably, the method further includes the step of forming a number of photoshields overlying the top surface of the dielectric layer, the photoshields including a number of openings extending therethrough and disposed about the number of photosensitive elements (step 610). Generally, the photoshields are formed from a patterned layer of a refractory metal and/or a refractory metal nitride, such as Ti, TiN or W, which is deposited using any suitable standard processing means including, for example, CVD, MOCVD, and ALD. The refractory metal/refractory metal nitride layer is then patterned using standard photolithography techniques and a suitable wet or dry etch process that is selective to the underlying dielectric and semiconducting materials.

Optionally, the method may further include the step of forming a number of openings extending through dielectric layer from the top surface thereof to the surface of the substrate to expose the number of photosensitive elements (step 612). The openings may be formed or etched in the dielectric layer using any suitable, highly anisotropic dielectric etch process such as that described above for forming the trenches around the photosensitive elements. That is the openings may be etched using a low pressure, RF or MW coupled plasma containing fluorinated hydrocarbon and/or fluorinated carbon compounds. In certain embodiments, where the step of forming a number of photoshields, step 610, precedes the step of forming a number of openings extending through the dielectric layer, step 612, and the photoshields may be advantageously used to serve as a hardmask for etching the openings through the dielectric layer.

Methods for fabricating image sensors having shield structures with a TAS or trench above sensor architecture will now be described with reference to FIG. 7.

Referring to FIG. 7, the method begins with forming a number of photosensitive elements or pixels on a surface of a substrate (step 702), followed by forming a dielectric layer on the substrate overlying the photosensitive elements (step 704). The photosensitive elements and dielectric layer may be formed using any suitable processing method as described above in connection with the TSS architecture.

Next, a patterned hardmask layer is formed overlying the dielectric layer (step 706). In one preferred embodiment, the patterned hardmask layer is formed a refractory metal and/or a refractory metal nitride, such as Ti, TiN or W, which also serves photoshields in completed image sensor, further reducing cross-talk between adjacent photosensitive elements or pixels. The patterned hardmask layer may be formed using any suitable standard deposition and patterning techniques as described above in connection with the TSS architecture.

A number of openings or trenches are formed in the dielectric layer extending from a top surface thereof to the surface of the substrate using the hardmask layer, each of the number of trenches disposed above one of the number of photosensitive elements (step 708). The trenches may be formed or etched using any suitable, highly anisotropic dielectric etch process and selective to the material of the hardmask, such as a low pressure, RF or MW coupled plasma containing fluorinated hydrocarbon and/or fluorinated carbon compounds as described above.

Finally, annular reflective guard rings or waveguides are formed in the dielectric layer above each of the photosensitive elements by forming or depositing a metal comprising layer on surfaces of the number of trenches (step 710), followed by removing the metal layer on bottom surfaces of the trenches to expose the photosensitive elements (step 712). Preferably, the waveguides are formed by depositing one or more layers of a refractory metal and/or a refractory metal nitride, such as Ti, TiN or W, using any suitable processing method including, for example, CVD, MOCVD, and ALD. More preferably, the metal layer on bottom surfaces of the trenches is removed to form the waveguides using a highly directional etch process, such as Reactive Ion Etching (RIE) or sputtering.

Optionally, the method may further include the step of filling the trenches inside of the annular reflective waveguides with a void-less dielectric material substantially transparent to at least one wavelength of light to which the number of photosensitive elements are sensitive (step 714). Suitable dielectric material can include, for example, a flowable oxide, such as SOG, PSG or BPSG, and can be formed by any suitable, processing technique, such as a spin-on-coating, or CVD.

The advantages of the image sensor and methods of forming the same of the present invention over previous or conventional approaches include: (i) substantially eliminating cross-talk between adjacent pixels, thereby improving the accuracy or image resolution of the image sensor; (ii) increasing the intensity of light received by the pixels, thereby improving photo-efficiency or sensitivity of the image sensor; while (iii) avoiding the increase in pixel size or reduction in pixel count required with image sensors having metal shielding used heretofore; and (iv) avoiding the need for a plurality of micro-lens or a micro-lens array to individually focus light on each pixel, thereby reducing fabrication costs and increasing throughput and/or yield of working sensors.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. For example, it will be appreciated by those skilled in the art that an image sensor according to the present invention can further include or be combined with a single lens or a small array of lens, the purpose of which is to focus light on the array of one or more photosensitive elements or pixels, rather than on an individual pixel, thereby further increasing the photo-efficiency of the image sensor. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. An image sensor comprising:
    a substrate having a surface with a plurality of pixels, the plurality of pixels comprising a pitch between each of the plurality of pixels parallel to the surface of the substrate selected to match a wavelength of light incident on the image sensor;
    a dielectric layer formed on the surface of the substrate; and
    a plurality of annular reflective waveguides each overlying one of the plurality of pixels and extending perpendicularly from the surface of the substrate through the dielectric layer to a top surface thereof, wherein each of the plurality of annular reflective waveguides comprise a cross-sectional dimension parallel to the surface of the substrate selected to match the wavelength of light incident on the image sensor.

2. An image sensor according to claim 1, wherein each of the plurality of pixels comprise a dimension parallel to the surface of the substrate selected to match the wavelength of light incident on the image sensor.

3. An image sensor according to claim 1, wherein each of the plurality of annular reflective waveguides comprises a plurality of individual intersecting walls.

4. An image sensor according to claim 3, wherein the plurality of individual intersecting walls of each of the plurality of annular reflective waveguides are formed in trenches disposed about a center of one of the plurality of pixels.

5. An image sensor according to claim 1, further comprising a photoshield disposed on the top surface of the dielectric layer above and about at least one of the plurality of pixels.

6. An image sensor according to claim 5, wherein the photoshield extends from the at least one of the plurality of pixels to an adjacent pixel.

7. An image sensor according to claim 5, wherein the photoshield and the plurality of annular reflective waveguides comprise one or more materials selected from the group consisting of Titanium (Ti), Titanium-Nitride (TiN), Tungsten (W) and Tungsten-Nitride (WN).

8. An image sensor comprising:
    a substrate having a surface with at least one photosensitive element formed therein;
    a dielectric layer formed on the surface of substrate;
    an annular reflective waveguide overlying the at least one photosensitive element, the annular reflective waveguide extending perpendicularly from the surface of the substrate through the dielectric layer to a top surface thereof; and
    wherein the reflective waveguide comprises a cross-sectional dimension parallel to the surface of the substrate selected to match a wavelength of light incident on the image sensor.

9. An image sensor according to claim 8, wherein the cross-sectional dimension of the reflective waveguide is substantially uniform from the surface of the substrate through the dielectric layer to the top surface thereof.

10. An image sensor according to claim 8, wherein the reflective waveguide extends perpendicularly from the surface of the substrate through the dielectric layer to the top surface thereof.

11. An image sensor according to claim 8, wherein the reflective waveguide comprises a plurality of individual intersecting walls.

12. An image sensor according to claim 11, wherein each of the plurality of individual intersecting walls are formed in trenches disposed about a center of the at least one photosensitive element.

13. An image sensor according to claim 8, further comprising a photoshield disposed on the top surface of the dielectric layer above and about the at least one photosensitive element.

14. An image sensor according to claim 8, wherein the reflective waveguide comprises one or more materials selected from the group consisting of Titanium (Ti), Titanium-Nitride (TiN), Tungsten (W) and Tungsten-Nitride (WN).

15. An image sensor comprising:
    a substrate having a surface with a plurality of pixels formed therein, each of the plurality of pixels comprising a dimension parallel to the surface of the substrate selected to match a wavelength of light incident on the image sensor;
    a dielectric layer formed on the surface of substrate; and
    a plurality of reflective waveguides extending from the surface of the substrate through the dielectric layer to a top surface thereof, each of the plurality of reflective waveguides overlying and in alignment with one of the plurality of pixels and each comprising a cross-sectional dimension parallel to the surface of the substrate selected to match the wavelength of light incident on the image sensor.

16. An image sensor according to claim 15, wherein the plurality of pixels comprise a pitch parallel to the surface of the substrate between each of the plurality of pixels selected to match the wavelength of light incident on the image sensor.

17. An image sensor according to claim 15, wherein the cross-sectional dimension of each of the plurality of reflective waveguides is substantially uniform from the surface of the substrate through the dielectric layer to the top surface of the dielectric layer.

18. An image sensor according to claim 17, wherein each of the plurality of reflective waveguides comprises a plurality of individual intersecting walls.

19. An image sensor according to claim 18, wherein the plurality of individual intersecting walls of each of the plurality of annular reflective waveguides are formed in trenches disposed about a center of one of the plurality of pixels.

20. An image sensor according to claim 15, further comprising a photoshield disposed on the top surface of the dielectric layer above and about the at least one of the plurality of pixels.

* * * * *